(12) United States Patent
Lovett

(10) Patent No.: US 10,957,365 B2
(45) Date of Patent: Mar. 23, 2021

(54) SETTING LOCAL POWER DOMAIN TIMEOUT VIA TEMPERATURE SENSOR SYSTEMS AND METHODS

(71) Applicant: Micron Technology, Inc., Boise, ID (US)

(72) Inventor: Simon J. Lovett, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 113 days.

(21) Appl. No.: 16/118,837

(22) Filed: Aug. 31, 2018

(65) Prior Publication Data
US 2020/0075063 A1 Mar. 5, 2020

(51) Int. Cl.
| | |
|---|---|
| G06F 1/32 | (2019.01) |
| G11C 5/14 | (2006.01) |
| H03K 19/20 | (2006.01) |
| G06F 1/20 | (2006.01) |
| G06F 1/3234 | (2019.01) |
| G11C 11/4074 | (2006.01) |

(52) U.S. Cl.
CPC .............. *G11C 5/148* (2013.01); *G06F 1/206* (2013.01); *G06F 1/3268* (2013.01); *G06F 1/3275* (2013.01); *G11C 11/4074* (2013.01); *H03K 19/20* (2013.01)

(58) Field of Classification Search
CPC ...................... G06F 1/32; G06F 1/28
See application file for complete search history.

(56) References Cited

U.S. PATENT DOCUMENTS

| | | | | |
|---|---|---|---|---|
| 5,650,739 | A * | 7/1997 | Hui | H03K 5/13 327/262 |
| 8,448,003 | B1 * | 5/2013 | Rosen | G06F 1/3287 713/323 |
| 9,411,400 | B1 * | 8/2016 | Dropps | G06F 1/3234 |
| 2007/0103188 | A1 * | 5/2007 | Hosoe | H03L 7/0812 326/30 |
| 2008/0083895 | A1 * | 4/2008 | Ueda | F02D 41/20 251/129.15 |
| 2010/0299693 | A1 * | 11/2010 | Sullivan | H04H 60/32 725/14 |
| 2012/0042188 | A1 | 2/2012 | Hirano | |
| 2014/0096102 | A1 * | 4/2014 | Fu | G06F 30/20 716/133 |
| 2015/0116882 | A1 * | 4/2015 | Bowers | H01L 27/0259 361/103 |
| 2018/0167057 | A1 * | 6/2018 | Pan | H03K 3/011 |
| 2019/0087701 | A1 * | 3/2019 | Xiao | G01D 13/00 |

\* cited by examiner

*Primary Examiner* — Keshab R Pandey
(74) *Attorney, Agent, or Firm* — Fletcher Yoder, P.C.

(57) ABSTRACT

A semiconductor device may include a local power domain configured to selectively provide or prevent power to a logic block of the memory device and a temperature sensor located on the semiconductor device. The semiconductor device may also include timeout circuitry to delay a power down of the local power domain by a timeout time based at least in part on temperature information from the temperature sensor.

24 Claims, 8 Drawing Sheets

SETTING LOCAL POWER DOMAIN TIMEOUT VIA TEMPERATURE SENSOR SYSTEMS AND METHODS

BACKGROUND

Embodiments described herein relate generally to the field of semiconductor devices. More specifically, the current embodiments include one or more systems, devices, and methods for setting a power down delay of a local power domain based at least in part on temperature.

DESCRIPTION OF RELATED ART

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Various modes of operation in memory devices and other logical circuit systems may implement logical circuits including multiple types of circuitry such as Boolean logic gates to yield certain outputs depending on the corresponding inputs. At any point in time, some logical circuits may be in use while others are not. However, when not in use, the logical circuits may still consume power (e.g., due to leakage current). Local power domains (LPDs) may supply power to one or more logical circuits individually, and, therefore, allow individual logical circuits to be powered down when not in use. The toggling of power to a logical circuit may also consume power, and rapid cycling of the LPD may lead to excessive power usage. Accordingly, embodiments described herein may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

To help reduce power consumption due to leakage current, in some embodiments, a clock enable signal (e.g., CKE) or other notification signal provides notice to a local power domain (LPD) of when power may be shut off to a logical circuit and when power is requested to be turned on. The CKE signal may or may not be periodic, and, as such, the power on request may be unpredictable by the LPD. As such, it may be advantageous to delay the powering down of a logical circuit to prevent rapid cycling of the LPD to decrease overall power consumption. The ideal delay time may correspond to the amount of leakage current consumed while the logical circuit is not in use and the amount of energy used to toggle the LPD. Furthermore, a logical circuit may have a higher leakage current at higher temperatures than at relatively cooler temperatures. Therefore, the power down delay may be based at least in part on the temperature of the logical circuit, which may be measured by an on-die temperature sensor (e.g., located on the same silicon substrate, chip, and/or circuit board as the logical circuit). Furthermore, in some embodiments, the output of the timeout circuitry may directly control power to the logical circuit without the use of a local power domain.

Figure 1:
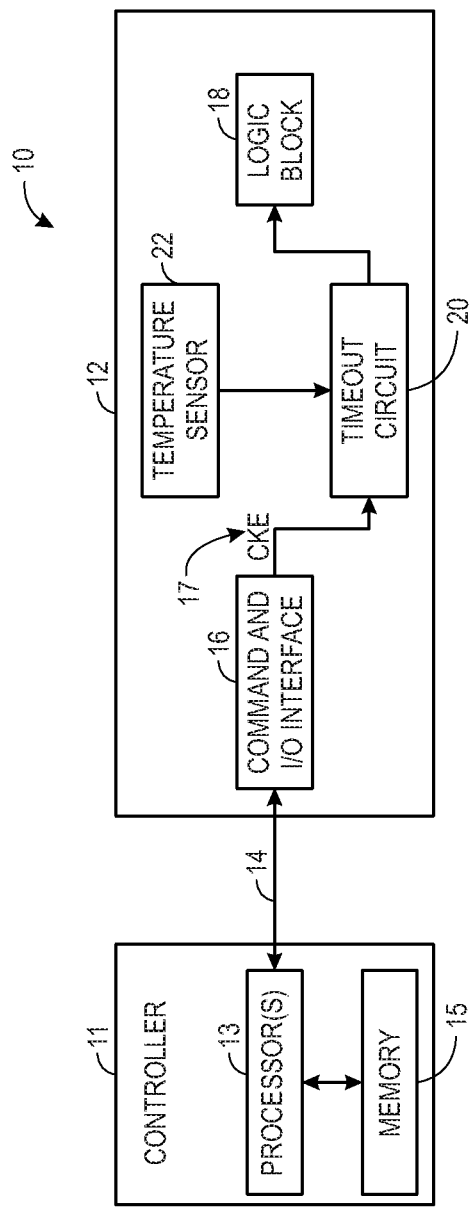
FIG. 1 is a block diagram illustrating a computer system, in accordance with an embodiment of the present disclosure.

Referring now to FIG. 1, a simplified block diagram of a computer system 10, which may include one or more LPDs for supplying power to a logical circuit, is illustrated. The computer system 10 includes a controller 11 and a semiconductor device 12. The controller 11 may include processing circuitry, such as one or more processors 13 (e.g., one or more microprocessors), that may execute software programs to provide various signals to the semiconductor device 12 over one or more bi-directional communication buses 14 to facilitate the transmission and receipt of data. Moreover, the processor(s) 13 may include multiple microprocessors, one or more "general-purpose" microprocessors, one or more special-purpose microprocessors, and/or one or more application specific integrated circuits (ASICS), or some combination thereof. For example, the processor(s) 13 may include one or more reduced instruction set (RISC) processors.

The processor(s) 13 may be coupled to one or more memories 15 that may store information such as control logic and/or software, look up tables, configuration data, etc. In some embodiments, the processor(s) 13 and/or the memory 15 may be external to the controller 11. The memory 15 may include a tangible, non-transitory, machine-readable-medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof). The memory 15 may store a variety of information and may be used for various purposes. For example, the memory 15 may store machine-readable and/or processor-executable instructions (e.g., firmware or software) for the processor(s) 13 to execute, such as instructions for providing various signals and commands to the semiconductor device 12 to facilitate the transmission and receipt of data to be written to, read from, processed by, or relayed by the semiconductor device 12.

The controller 11 may communicate with the semiconductor device 12 through one or more command and input/output (I/O) interfaces 16. In general, the command and input/output interfaces 16 provide access to various components of the semiconductor device 12 by external devices, such as the controller 11. Clock signals may be communicated between the semiconductor device 12 and external devices such as the controller 11 to provide synchronous data transfer and for internal use within the semiconductor device 12. For example, a CKE signal 17 may provide indications of when to enable and/or disable logical circuits such as a logic block 18. The CKE signal 17 may be communicated to the semiconductor device 12, for example, from the controller 11, or generated by circuitry within the semiconductor device 12.

In one embodiment, the CKE signal 17 may be used to control an LPD of a logic block 18 on the semiconductor device 12. Additionally, a timeout circuit 20 may be used to delay powering down the logic block 18 based on temperature. One or more temperature sensors 22 may be located on die or in close proximity to the semiconductor device 12, and may measure direct temperature of the logic block 18, ambient temperature, or an overall (e.g., average) temperature of the semiconductor device 12. In one embodiment, the temperature sensor 22 is located on the semiconductor device 12 so as to ascertain the temperature of the logic block 18. As such, multiple LPDs of a semiconductor device 12 may each have timeout circuits 20 dependent upon temperature sensors 22 located the respective logic blocks 18 for each LPD. Additionally or alternatively, multiple LPDs may use a single timeout circuit 20, and/or multiple timeout circuits 20 may share a common temperature sensor 22.

Figure 2:
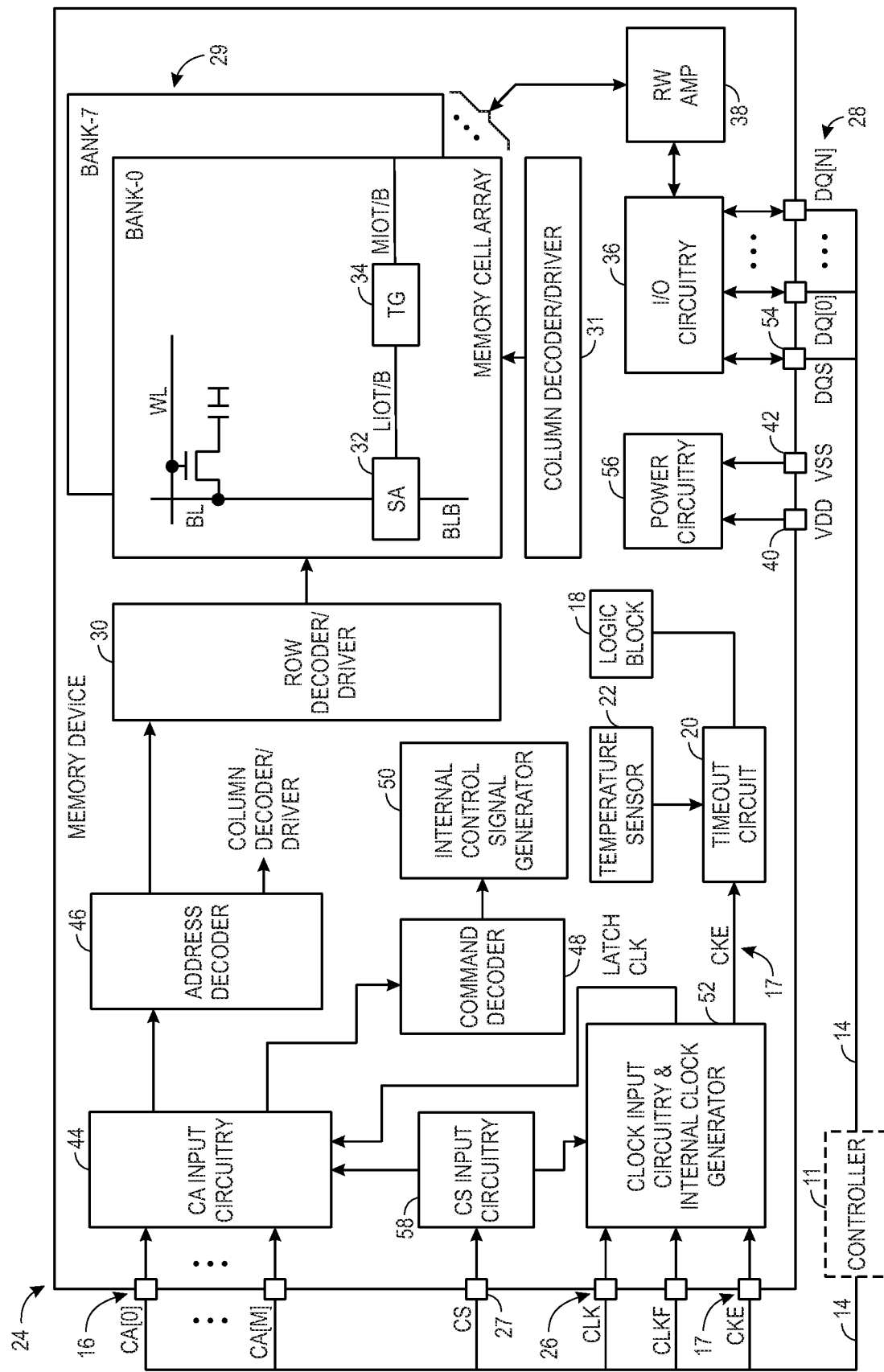
FIG. 2 is a block diagram illustrating an example memory device, in accordance with an embodiment of the present disclosure.

As should be appreciated, the controller 11 and semiconductor device 12 may be implemented as separate components or together as a single device. Furthermore, LPDs, logic blocks 18, and timeout circuits 20 may be implemented on any suitable semiconductor device 12. For example, FIG. 2 is a functional block diagram illustrating a memory device 24 as an example semiconductor device 12. In some embodiments, the memory device 24 may be disposed in (physically integrated into or otherwise connected to) a host device or otherwise coupled to a host device. The host device may include any one of a desktop computer, a laptop computer, a pager, a cellular phone, a personal organizer, a portable audio player, a control circuit, a camera, and the like. The host device may also be a network node, such as a router, a server, and/or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. It is noted that the terms used to describe these various examples of systems, like many of the other terms used herein, may share some referents and, as such, should not be construed narrowly in virtue of the other items listed.

The host device may, thus, be a processor-based device, which may include a processor, such as a microprocessor, that controls the processing of system functions and requests in the host device. Further, any host processor may comprise a plurality of processors that share system control. The host processor may be coupled directly or indirectly to additional system elements of the host device, such that the host processor controls the operation of the host device by executing instructions that may be stored within the host device or external to the host device.

In some embodiments, the memory device 24 may include a DDR5 (Double Data Rate 5) SDRAM (synchronous dynamic random access memory) integrated on a semiconductor chip, a LPDDR4 (Low Power Double Data Rate 4) type DRAM (dynamic random access memory) integrated on a single semiconductor chip, and the like. However, as will be appreciated, the embodiments discussed herein may be utilized with any suitable type of memory device 24. Each electronic device is provided with a memory device 24 coupled to an external terminal. It should be understood that these external terminals may be bonding pads, inputs, pins, terminals, and the like, but are referred to as pads for ease of discussion herein. The memory device 24 may facilitate operations (e.g., read and/or write operations) based at least in part on a command/address signals (e.g., CA signals) and/or clock signals (e.g., Clk and ClkF).

The CA signals and the clock signals may be supplied to CA pads 25 and clock pads 26 of the electronic device, for example, via a CA bus and a clock bus, or any suitable communicative coupling from a controller 11 or host processor. The CA signals and the external clock signals may be supplied to the memory device 24 or generated on board, thereby facilitating access operations with respect to memory cell arrays included in the memory device 24. In addition, the memory device 24 may receive additional signals, such as chip select (CS) signals, from a controller, and these signals may be individually supplied to one or more memory devices 24 of the electronic device. As depicted, the memory device 24 receives a chip select signal at a chip select pad 27. The chip select signal may enable the memory device 24 for memory operations.

Memory device data (DQ) may be read from or written to the memory device 24 at data (e.g., DQ) pads 28 via a communicative coupling. In some embodiments, a memory device 24 may not permit both reading and writing actions, such as in the case of a read only memory (ROM) based electronic device.

A memory device 24 may include one or more memory cell arrays 29 (e.g., memory banks BANK-0 to Bank-7), which each respectively may include word lines (WL) and bit lines (BL, inverse BL as BLB). A row decoder/driver 30 may select word lines, while a column decoder/driver 31 may select bit lines. The bit lines may be paired and coupled to a sense amplifier 32 (SA) of a memory cell array 29. The sense amplifier 32 may amplify a voltage difference generated between the bit lines BL and BLB. The sense amplifier 32 may also supply read data based at least in part on the voltage difference generated between the bit lines BL and BLB to complementary local input/output lines (LIOT/B), where the local input/output line may represent a pair of line (e.g., normal and inverted lines). The read data supplied to the local input/output lines may be transferred to complementary main input/output lines (MIOT/B) via a switch circuit (TG) 34. The read data on the main input/output lines may be converted to single ended signals and transmitted to a data input/output circuit 36 via a read/write amplifier 38 (RW AMP) that acts to translate electrical signal values (e.g., voltage levels) between values interpretable at the pads and values interpretable by the internal memory cell array 29.

As described previously, the memory device 24 may include the CA pads 25, the clock pads 26, the data pads 28, and one or more chip select pads 27. The memory device 24 may also include a voltage pad 40 to receive a first amount of voltage and a voltage pad 42 to receive a second amount of voltage, for example, the first and second amounts of voltage corresponding to logical high and low voltage values (e.g., VDD and VSS), respectively. The CA signals are received at the CA pads 25 and may be transmitted to a CA input circuitry 44. The memory device 24 may include any suitable number of CA pads 25, and as depicted, the memory device 24 includes m-number of CA pads 25.

As previously described, the CA signals may include address signals and command signals. The address signals may transmit to an address decoder 46 and the command signals may transmit to a command decoder 48. The address decoder 46 may supply row addresses to a row decoder/driver 30 and column addresses to a column decoder/driver 31. The command decoder 48 may generate internal commands by decoding the command signals, and may transmit the internal commands to an internal control signal generator 50. For example, the command decoder 48 may generate active signals, read signals, write signals, and the like to transmit to the internal control signal generator 50. In response to the output from the command decoder 48 the internal control signal generator 50 may enable and/or disable a variety of control signals to operate memory device 24 circuitry, for example, mode registers, delay circuitry, reset control circuitry, the column decoder/driver 31, and the row decoder/driver 30, and the like, to perform operations according to the internal commands, such as resetting operations, reading operations, and/or writing operations. For example, in response to an activate command, the command decoder 48 and the internal control signal generator 50 may operate to enable a word line responsive to a row address transmitted to the memory device 24. The CA input circuitry 44, the address decoder 46, the command decoder 48, the column decoder/driver 31, and the row decoder/driver 30 may constitute a CA control circuit and may access the memory cell array 29.

The clock signals may transmit to the memory device 24 at clock pads 26. The external clock signal Clk and the external clock signal ClkF may be mutually complementary signals (e.g., ClkF is inverse of Clk), and may both be supplied to a clock input circuitry and/or internal clock generator, herein referred to as clock input circuitry 52. The clock input circuitry 52 may generate one or more internal clock signals, such as a latch clocking signal used as a timing signal that defines operation of one or more latching circuits of the memory device 24. The clock input circuitry 52 may also generate various other clocking signals, such as a phase-controller internal clock signal.

The voltage pad 40 and the voltage pad 42 may receive power-source potentials for a system high voltage (VDD) and for a system low voltage (VSS). The power-source potentials may be supplied to power circuitry 56. The power circuitry 56 may generate various internal potentials based at least in part on the power-source potentials. The internal potentials may transmit to the row decoder 30, the sense amplifiers 32, and the like to facilitate operation of the memory device 24. Furthermore, the voltage pad 40 and the voltage pad 42 may operatively couple to a power-on detector to determine if electrical signals (e.g., current) are flowing at the voltage pad 40 and/or the voltage pad 42. In response to this determination, a memory device 24 may change operation, for example, may act to reset its own circuitry to prepare for a next memory operation.

In addition, the chip select pad 27 may receive a chip select signal to activate the memory device 24 for memory operations. The chip select signal transmits from the chip select pad 27 to a chip select input circuitry 58. The chip select input circuitry 58 includes a variety of circuitry to enable the CA input circuitry 44 to permit transmission of CA signals into the memory device 24.

As will be appreciated, various other components such as power supply circuits, mode registers, read/write amplifiers, etc., may also be incorporated into the memory device 24. Furthermore, the timeout circuit 20 and temperature sensor 22 of the disclosed techniques may be used with any suitable logic block 18 within the various components of a memory device 24 or other semiconductor device 12. Accordingly, it should be understood that the block diagram of FIG. 2 is provided to highlight certain functional features of a memory device 24 as an example semiconductor device 12, and is non-limiting.

Figure 3:
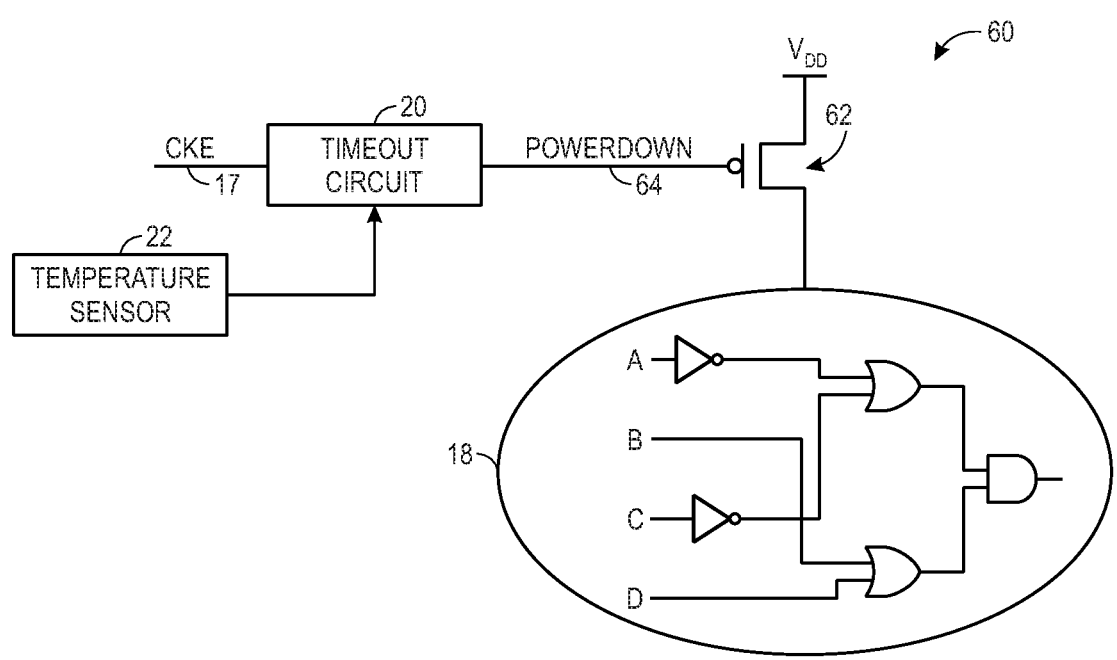
FIG. 3 is a schematic diagram of example power control circuitry, in accordance with an embodiment of the present disclosure.

In further illustration, FIG. 3 is a schematic diagram of power control circuitry 60 utilizing an LPD 62. An incoming CKE signal 17 may provide an indication of when power is allowed to be shut off (e.g., the LPD is not currently in use) to a logic block 18 and when power is requested to be on. As stated above, the CKE signal 17 may or may not be periodic, and, as such, a power on request may be unpredictable. Although unpredictable, in some embodiments, there may be little leeway in the timing for powering up the logic block 18. In other words, when power is requested to the logic block 18, the LPD 62 may be cycled to, or remain in, the power on state regardless of the previous state of the LPD 62 or timeout circuit 20. When the CKE signal 17 notifies the timeout circuit that it is possible to turn off the logic block 18 (e.g., the logic block 18 is not currently in use) the timeout circuit 20 may delay the powering down of the logic block 18 to prevent rapid cycling of the LPD 62 in such a case where power is requested to the logic block 18 very quickly after a power down CKE signal 17 notification. For example, if the subsequent call for power after a power down CKE signal 17 is less than the timeout delay, the LPD 62 may not cycle the power to the logic block 18. The prevention of rapid cycling of the LPD 62 may decrease overall power consumption by incurring the leakage current for a short duration instead of the greater energy cost associated with toggling the LPD 62.

The optimum delay may take into account the amount of leakage current consumed while the logical circuit is not in use and the amount of energy used to toggle the LPD 62. Depending on the temperature of the logic block 18, for example as measured by the temperature sensor 22, the optimal delay may change. In response to the CKE signal 17 and the temperature sensor input, the timeout circuit 20 may output a powerdown signal 64 to the LPD 62 to turn off power to the logic block 18 and cease or reduce current leakage. As will be appreciated, although the logic block 18 is depicted as a group of Boolean logic gates, the logic block 18 may be any suitable circuit where it may be desirable to power down the logic block 18 to prevent current leakage, for example via an LPD 62.

Figure 4:
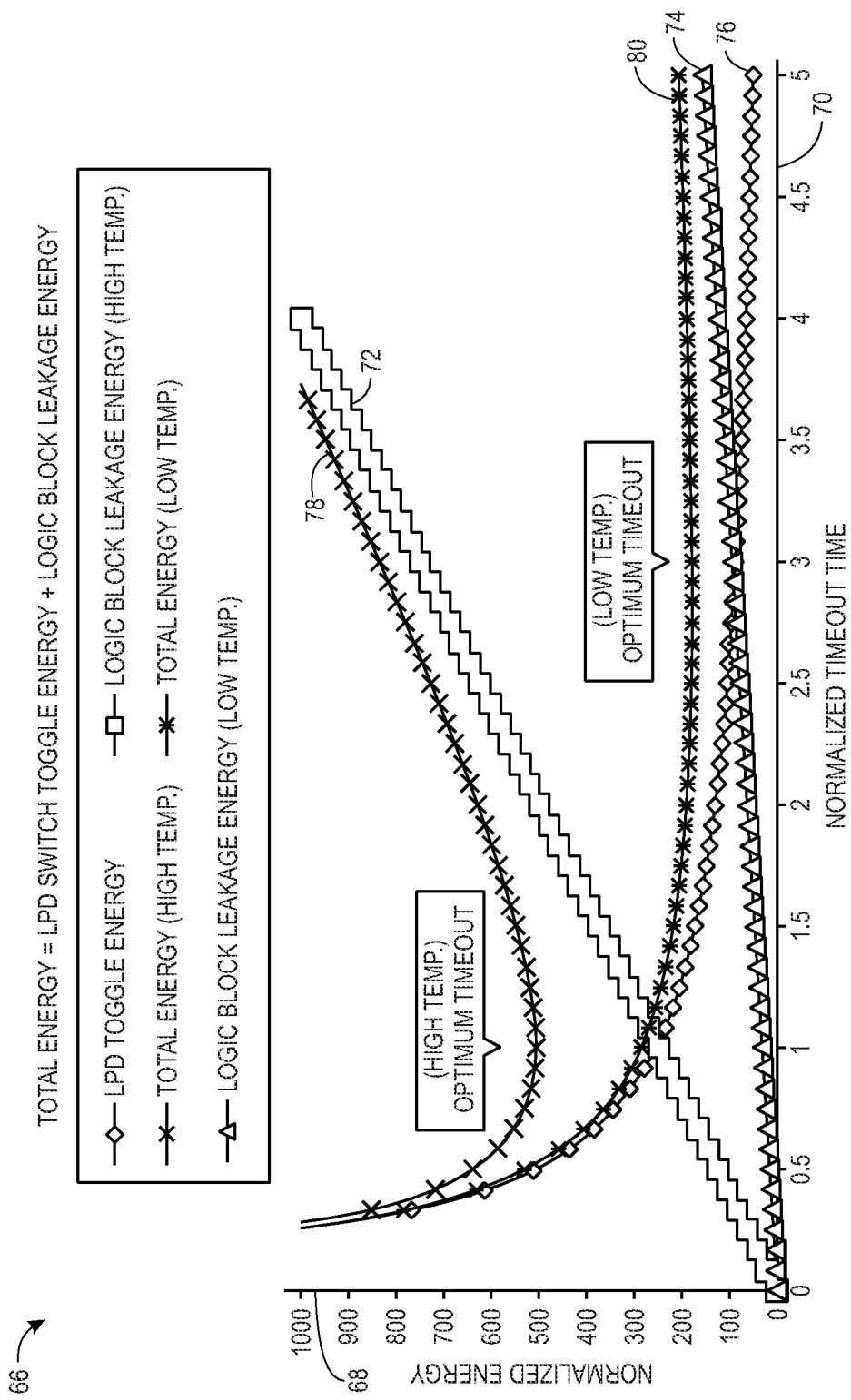
FIG. 4 is a graph of energy usage versus timeout time, in accordance with an embodiment of the present disclosure.

As stated above, the leakage current of logic block 18 may be dependent on the temperature of the logic block 18. FIG. 4 is a graph 66 of normalized energy usage on the y-axis 68 and normalized timeout time on the x-axis 70. As depicted by the graph 66, the leakage energy at high temperature (e.g., 90 degrees centigrade (C)) 72 is greater than the leakage energy at low temperature (e.g., 25 C) 74 over the course of a given timeout. Although shown as a constant leakage energy (e.g., a linear energy usage over time), depending on implementation, leakage energy may be represented by different characteristic curves (e.g., polynomial, exponential, a logarithmic, etc.). Additionally, the LPD toggle energy 76 amortized over the course of the timeout may decrease with larger timeout delays because of the approximately fixed energy cost associated with toggling the LPD 62. The maximum total energy used for a particular timeout at a given temperature is the sum of the LPD toggle energy 76 and the leakage energy 72, 74 for the given temperature. Although this is the maximum total energy, as stated above, less energy may be used if the CKE signal 17 calls for a power on state of the logic block 18 before the end of the timeout, thus not toggling the LPD 62. The minimum of the total high temperature energy 78 yields the optimal timeout for the high temperature case, and the minimum of the total low temperature energy 80 yields the optimal timeout for the low temperature case. This minimum may also correspond to the timeout where the cumulative leakage energy equals the amortized LPD toggle energy 76.

Figure 5:
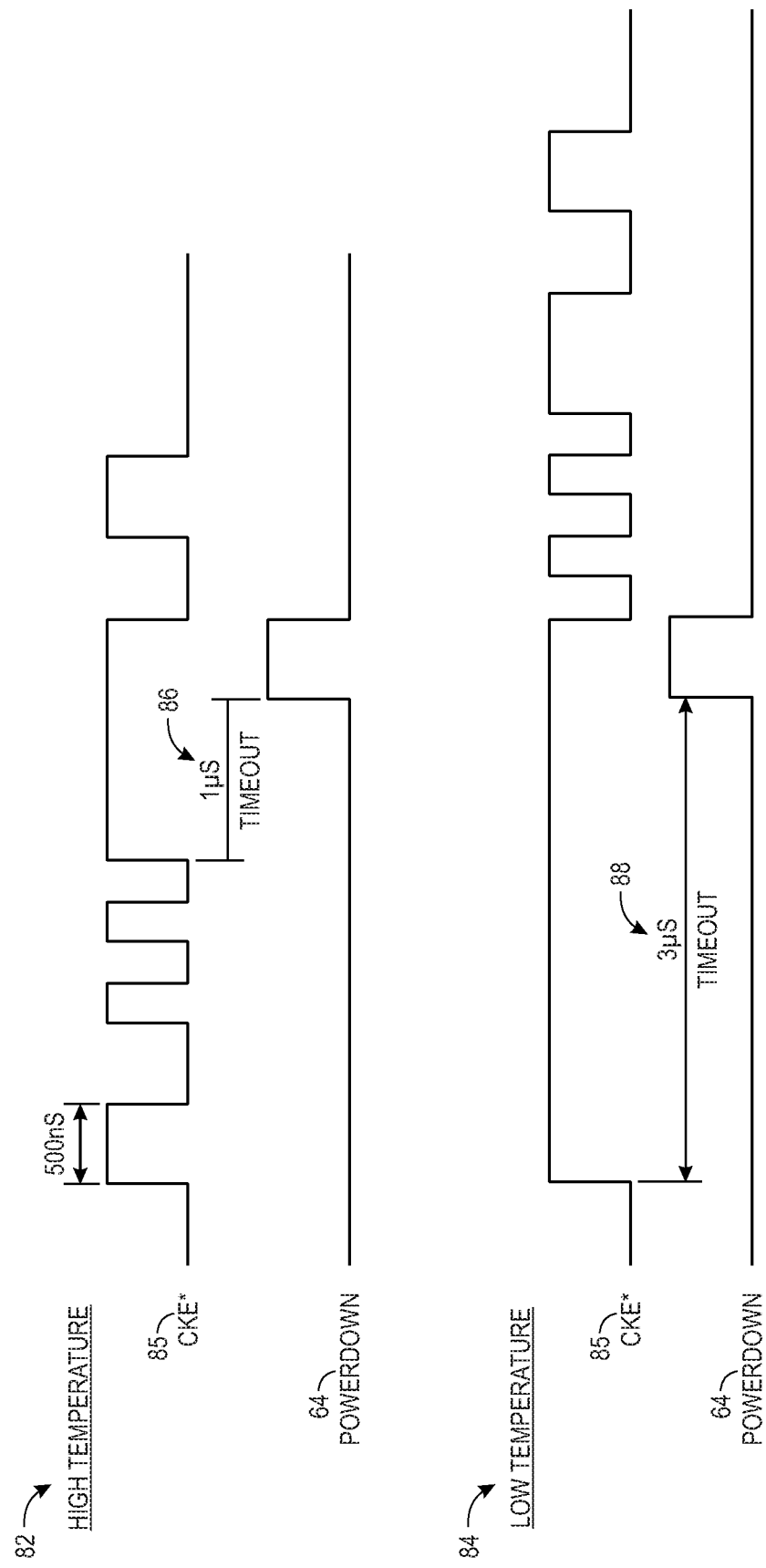
FIG. 5 is an illustration of example timing diagrams for a high temperature scenario and a low temperature scenario, in accordance with an embodiment of the present disclosure.

To help illustrate the implementation of the optimal timeout, FIG. 5 shows a high temperature timing diagram 82 and a low temperature timing diagram 84. In some embodiments, when the CKE signal 17 indicates a logical high, power may be requested to the logic block 18. Conversely, when the CKE signal 17 indicates a logical low, the LPD 62 may be turned off (e.g., the logic block 18 is not in use). Additionally, a logical high for the powerdown signal 64 may turn power off to the LPD 62. For illustrative purposes, the complement of the CKE signal 17, CKE* signal 85, is used to help demonstrate the timeout delay. As will be appreciated, logical high or low may be used to indicate a power on state depending on implementation and/or complementary signals may be used to indicate the desired state of the LPD 62. The powerdown signal 64 from the timeout circuit 20 has a delayed logical high response to the CKE* signal 85. For the sake of example, the high temperature timeout 86 is set at 1 microsecond (μs). Although the example depicts 1 μs for the high temperature scenario, the timeout delay may be any length of time depending on the implementation (e.g., logic block leakage current, LPD toggle energy) and the temperature of the logic block 18. As such, the timeout delay may be on the order of magnitude of nanoseconds, microseconds, milliseconds, seconds, etc. In the high temperature case, segments of the CKE* signal 85 that go to logical high for less than the high temperature timeout 86 (e.g., 500 nanoseconds) are ignored. However, if the CKE* signal 85 is at logical high for greater than the high temperature timeout 86, the powerdown signal 64 may go to logical high after the timeout period and instruct the LPD 62 to turn off power to the logic block 18.

Similar to the high temperature timing diagram 82, the low temperature timing diagram 84 depicts the powerdown signal 64 from the timeout circuit 20 in response to the CKE* signal 85. In the low temperature case, the logic block 18 may leak less current than the high temperature case. As such, the low temperature timeout 88 may be a longer period of time (e.g., 3 μs) than the high temperature timeout 86. In the aggregate, the energy savings due to a reduction in cycling of the LPD 62 outweighs the leakage current incurred during the timeout delay.

As stated above, the CKE signal 17 may be unpredictable. However, if the CKE signal 17 is predictable, for example periodic, power savings may be further increased. In such a case, if the predicted length of a logical high of the CKE* signal 85 (e.g., the time length the logic block 18 is not in use and may be turned off) is greater than the timeout delay at the given temperature, the LPD 62 may be toggled to the off state immediately or at a time less than the corresponding timeout. If the predicted length of the CKE* signal 85 being at logical high is less than the timeout delay, the powerdown signal 64 remains at logical low to keep the LPD 62 from toggling.

Figure 6:
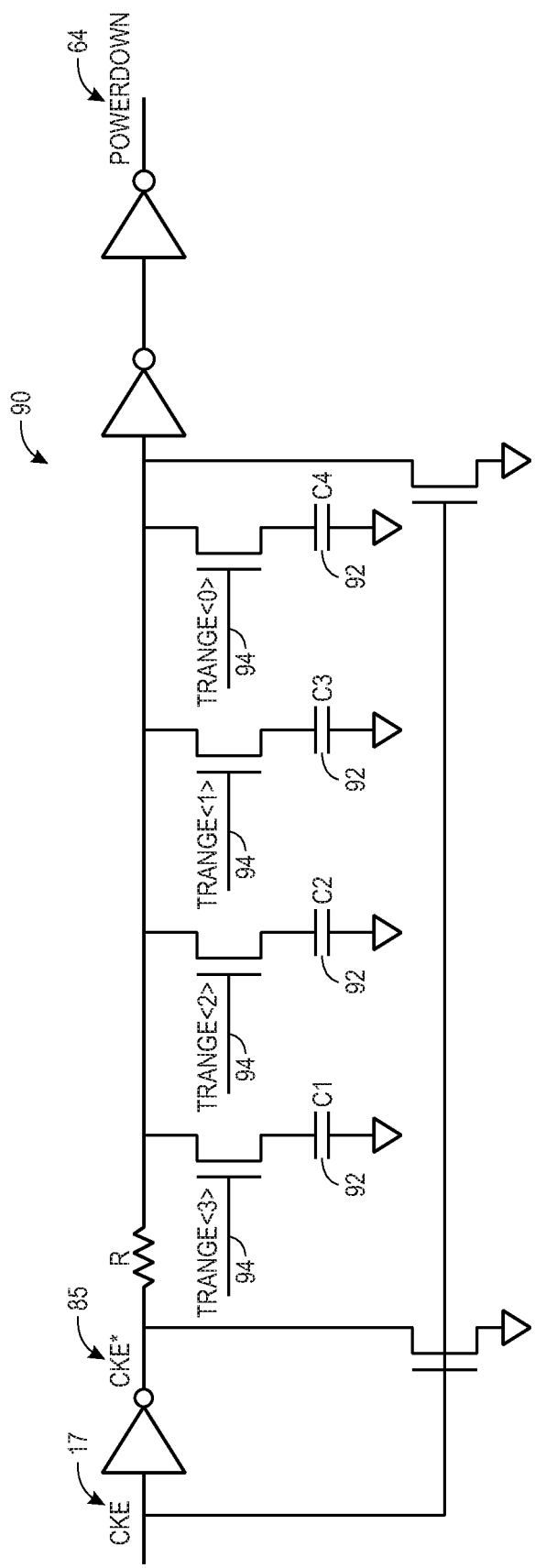
FIG. 6 is a schematic diagram of example timeout circuitry, in accordance with an embodiment of the present disclosure.

FIG. 6 is one example of a timeout circuit 20 using a resistor-capacitor (RC) circuit 90 to calculate the timeout delay based on the temperature of the logic block 18. In the illustrated example, the CKE signal 17 is inverted to the CKE* signal 85 to charge one or more capacitors when the CKE signal 17 indicates that power may be shut off from the logic block 18 (e.g., logical low). Depending on the temperature sensed by the temperature sensor 22, the RC circuit 90 may have increased or decreased capacitance and, therefore, take a shorter or longer amount of time to trigger the powerdown signal 64. For example, at cooler temperatures, more capacitors 92 may be connected to the RC circuit 90 in response to inputs 94 from the temperature sensor 22. The additional capacitors increase the capacitance and charge up time of the RC circuit 90, thus increasing the timeout delay. Conversely, capacitance of the RC circuit 90 may be reduced at hotter temperatures. When the CKE signal 17 requests power to the logic block 18 (e.g., a logically high CKE signal 17), the RC circuit 90 may be grounded out, thus resetting the timeout delay for the next CKE signal event.

Figure 7:
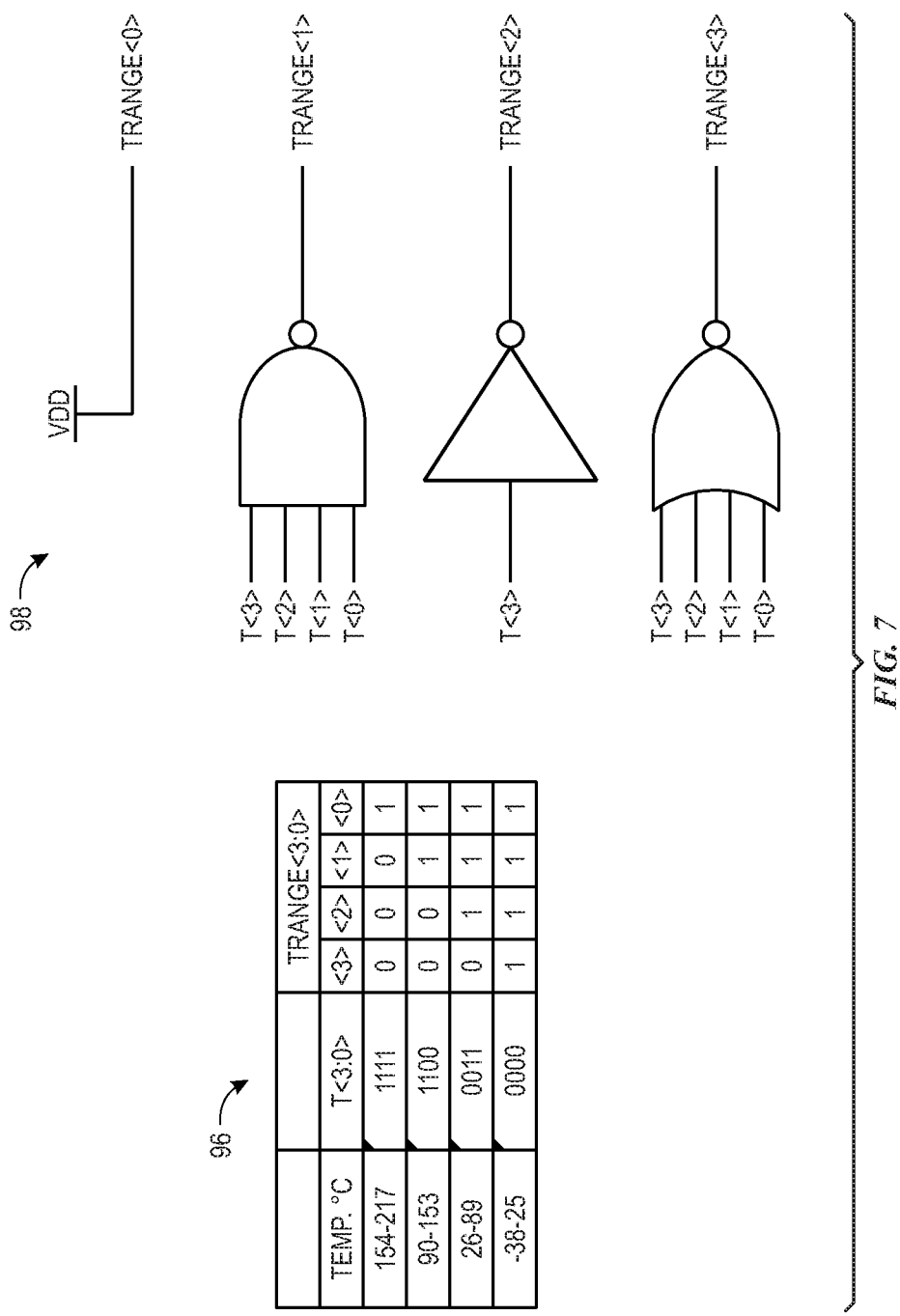
FIG. 7 is a schematic diagram of example logic outputting temperature information.

In further illustration of an example timeout circuit 20, FIG. 7 is a temperature table 96 and example logic 98 of the output (e.g., T<3:0>) of a temperature sensor 22 and the inputs 94 (e.g., TRANGE<3:0>) to the RC circuit 90. In the depicted example, the temperature sensor output is a 4-bit indication representing temperatures from approximately −38 C to 217 C. The example logic 98 is shown as an example only, and, as such, is non-limiting. The example logic 98 may be incorporated into the timeout circuitry 20, the temperature sensor 22, or elsewhere on the semiconductor device 12. In some embodiments, the outputs of the temperature sensor 22 may be directly connected to the timeout circuitry 20 as inputs 94.

As will be appreciated, any suitable temperature sensor 22 outputting a characteristic value of the temperature of the logic block 18 may be used. For example, in some embodiments, the temperature sensor may be a 1-bit threshold temperature sensor. At temperatures above the threshold, a longer timeout delay may be used relative to a timeout delay corresponding to a temperature below the threshold. The fidelity of the temperature sensor 22 may use any number of bits (e.g., 1, 2, 4, 8, etc.) depending on the implementation and the desired precision of the timeout delay. Likewise, although shown using four capacitors 92, an RC circuit 90 may include any number of capacitors depending on implementation and/or the desired precision.

The example timeout circuit 20 depicted by the RC circuit 90 and the example logic 98 are given as examples only, and are non-limiting. The timeout circuit 20 may be any suitable circuit for creating a timeout delay for the LPD 62 based on temperature. Other examples of a timeout circuit may include an analog circuit, digital logic, a multiplexer, one or more counters, computations in software, or a combination thereof.

Figure 8:
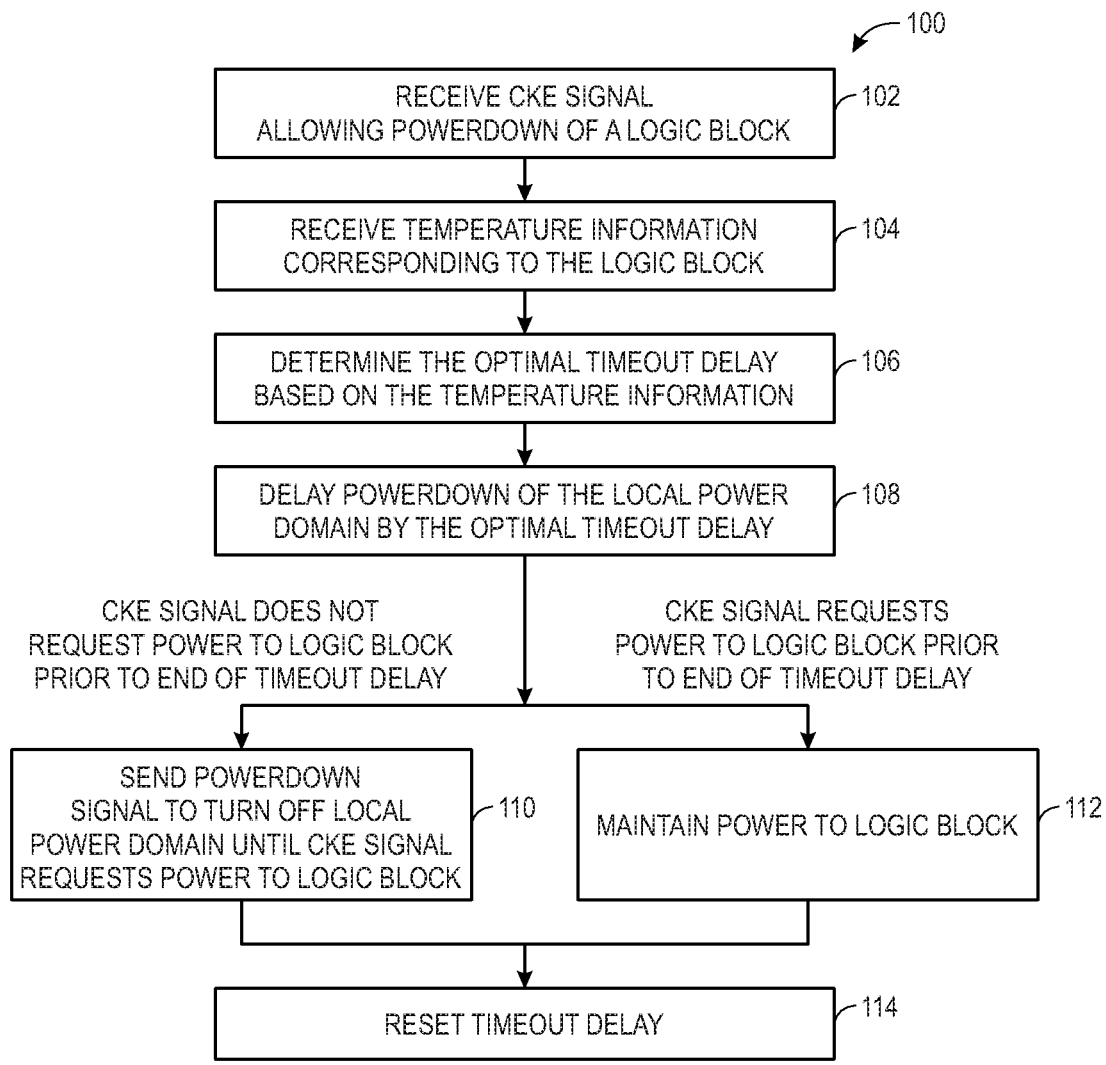
FIG. 8 is a flowchart of an example method for delaying power down of a logic block, in accordance with an embodiment of the present disclosure.

FIG. 8 is a flowchart 100 of an example process for applying an optimal timeout delay to the LPD 62 of a logic block 18. A timeout circuit 20 may receive a CKE signal 17 allowing the power down of a logic block 18 (process block 102). The timeout circuit 20 may also receive temperature information corresponding to the logic block 18 (process block 104). The optimal timeout delay may be determined based at least in part on the temperature information (process block 106). The optimal timeout delay may then be implemented to delay the power down of the LPD 62

(process block 108). If the CKE signal 17 does not request power to the logic block 18 prior to the end of the timeout delay, the powerdown signal 64 may be sent to the LPD 62 to turn off power to the logic block 18 until the CKE signal 17 requests power to the logic block 18 to be restored (process block 110). If the CKE signal 17 does request power to the logic block 18 prior to the end of the timeout delay, power may be maintained to the logic block 18 (process block 112). The timeout delay may be reset for the next power down availability and/or temperature change (process block 114). As should be appreciated, although the flowchart 100 is depicted in a particular order, in certain embodiments, steps may be reordered, altered, deleted, repeated, and/or occur simultaneously.

While the current techniques may be susceptible to various modifications and alternative forms, specific embodiments have been shown by way of example in the drawings and have been described in detail herein. However, it should be understood that the current techniques are not intended to be limited to the particular forms disclosed. Rather, instead the present embodiments are intended to cover all modifications, equivalents, and alternatives falling within the spirit and scope of the present techniques as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device comprising:
   a local power domain configured to selectively provide or prevent power to a logic block of the memory device;
   a temperature sensor located on the memory device; and
   timeout circuitry configured to delay a power down of the local power domain by a timeout time based at least in part on temperature information from the temperature sensor, wherein the timeout circuitry is configured to maintain the local power domain in a power on state in response to a first signal notification of an allowed power off state for a duration of the timeout time, and wherein the timeout circuitry is configured to continue to maintain the local power domain in the power on state in response to a second signal notification of an allowed power on state occurring temporally before an end of the timeout time.

2. The memory device of claim 1, wherein the timeout circuitry is configured to delay the power down of the local power domain in response to the first signal notification of the allowed power off state of the local power domain.

3. The memory device of claim 1, wherein the first signal notification, the second signal notification, or both comprises a CKE signal.

4. The memory device of claim 1, wherein the allowed power off state indicates temporary non-usage of the logic block.

5. The memory device of claim 1, wherein the timeout circuitry is configured to determine the timeout time based at least in part on a leakage current of the logic block, a toggle energy of the local power domain, or a combination thereof.

6. The memory device of claim 5, wherein the timeout time comprises a period of time wherein a total of the leakage current over the period of time is estimated to equal the toggle energy amortized over the period of time.

7. The memory device of claim 1, wherein the timeout circuitry is configured to send a powerdown signal to the local power domain after the timeout.

8. The memory device of claim 1, wherein the memory device is operatively coupled to a controller.

9. The memory device of claim 1, wherein the temperature sensor comprises a 4-bit temperature sensor.

10. A semiconductor device comprising:
    logic circuitry configured to process signals in the semiconductor device;
    a temperature sensor configured to sense a temperature corresponding to the logic circuitry; and
    timeout circuitry configured to control power to the logic circuitry, wherein controlling the power to the logic circuitry comprises delaying power down by a timeout delay, wherein the timeout delay is based at least in part on the temperature, wherein the timeout circuitry is configured to determine the timeout delay based at least in part on a leakage current of the logic circuitry, a toggle energy of the logic circuitry, or a combination thereof, and wherein the timeout time comprises a period of time wherein a total of the leakage current over the period of time is estimated to equal the toggle energy amortized over the period of time.

11. The semiconductor device of claim 10, wherein the timeout circuitry is configured to control the power to the logic circuitry via a local power domain.

12. The semiconductor device of claim 10, wherein the timeout circuitry is configured to delay powering down the logic circuitry in response to an indication that the logic circuitry is not in use.

13. The semiconductor device of claim 10, wherein the timeout circuitry is configured to not toggle power off to the logic circuitry before an end of the timeout delay.

14. The semiconductor device of claim 13, wherein the timeout circuitry comprises a resistor-capacitor (RC) circuit.

15. The semiconductor device of claim 14, wherein a capacitance of the RC circuit is increased in response to an increase in the temperature, wherein the increase in the capacitance increases the timeout delay.

16. The semiconductor device of claim 10, wherein the temperature sensor is located on-die with the logic circuitry of the semiconductor device.

17. The semiconductor device of claim 10, wherein the temperature is an average temperature of the semiconductor device.

18. The semiconductor device of claim 10, wherein the semiconductor device comprises a memory device.

19. A method, comprising:
    receiving temperature information corresponding to a logic block of a semiconductor device;
    determining a timeout delay of a powerdown signal based at least in part on the temperature information, wherein the powerdown signal is configured to turn power off to the logic block, wherein the timeout delay is determined based at least in part on a leakage energy of the logic block, wherein the leakage energy is estimated based at least in part on the temperature information; and in response to a signal notification that the logic block is not in use, delaying powering off the logic block by the timeout delay.

20. The method of claim 19, comprising maintaining power to the logic block during the timeout delay and not powering down the logic block in response to a power on signal prior to an end of the timeout delay.

21. The method of claim 19, comprising resetting the timeout delay in response to a power on signal.

22. The method of claim 19, comprising turning off power to the logic block after the timeout delay.

23. The method of claim 19, wherein determining the timeout delay comprises weighing the leakage energy of the logic block against a toggle energy corresponding to powering off the logic block.

24. The method of claim 23, wherein the toggle energy is amortized over the timeout delay.

\* \* \* \* \*